US011744016B2

(12) United States Patent
Odagaki

(10) Patent No.: US 11,744,016 B2
(45) Date of Patent: Aug. 29, 2023

(54) ELECTRONIC DEVICE CAPABLE OF SUPPRESSING TEMPERATURE RISE OF HEAT GENERATING COMPONENT AND REDUCING IN SIZE

(71) Applicant: CANON KABUSHIKI KAISHA, Tokyo (JP)

(72) Inventor: Koichi Odagaki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 197 days.

(21) Appl. No.: 17/364,083

(22) Filed: Jun. 30, 2021

(65) Prior Publication Data
US 2022/0015223 A1 Jan. 13, 2022

(30) Foreign Application Priority Data
Jul. 10, 2020 (JP) .................... 2020-119293

(51) Int. Cl.
*H05K 1/18* (2006.01)
*H05K 1/14* (2006.01)

(52) U.S. Cl.
CPC ..... *H05K 1/14* (2013.01); *H05K 2201/10151* (2013.01)

(58) Field of Classification Search
CPC .......... H05K 1/14; H05K 2201/10151; H05K 2201/05
USPC ...................................... 361/749
See application file for complete search history.

(56) References Cited

U.S. PATENT DOCUMENTS

| 6,583,990 B2* | 6/2003 | Serizawa | H05K 3/361 361/749 |
| 2002/0090844 A1* | 7/2002 | Kocin | H05K 7/1444 439/74 |
| 2006/0067066 A1* | 3/2006 | Meier | G06F 1/189 439/493 |
| 2009/0142955 A1* | 6/2009 | Fujikawa | H01R 12/772 439/449 |

FOREIGN PATENT DOCUMENTS

JP 2016-082261 A 5/2016

* cited by examiner

*Primary Examiner* — Binh B Tran
(74) *Attorney, Agent, or Firm* — Cowan, Liebowitz & Latman, P.C.

(57) ABSTRACT

An electronic device capable of suppressing a temperature rise of a heat generating component and reducing the size of the heat generating component. The electronic device comprising a first substrate on which a first electronic component that generates heat during operation and a first connector are mounted, a second substrate on which a second electronic component that generates heat during operation and a second connector are mounted, and a cable having one end connected to the first connector and the other end connected to the second connector. In the electronic device, the second substrate has a hole defining the second substrate into a first region and a second region, and the cable is inserted through the hole, and on the second substrate, the second connector is mounted in the first region, and the second electronic component is mounted in the second region.

11 Claims, 4 Drawing Sheets

ELECTRONIC DEVICE CAPABLE OF SUPPRESSING TEMPERATURE RISE OF HEAT GENERATING COMPONENT AND REDUCING IN SIZE

BACKGROUND OF THE INVENTION

Field of the Invention

The present invention relates to an electronic device, and more particularly, to a technique for suppressing a temperature rise of an electronic component disposed inside the electronic device.

Description of the Related Art

In an electronic device such as a digital camera, the processing capability of various integrated circuits (ICs) such as an image pickup device and a driver IC is enhanced in order to achieve high functionality and high performance, and accordingly, the power consumption of the IC or the like increases and the amount of heat generated by the IC or the like also increases. Therefore, there is a demand for a technique for controlling a flow of heat inside an electronic device in order to suppress a local increase in exterior temperature of the electronic device due to heat generation of an IC or the like and to suppress a decrease in performance due to a temperature rise of an electronic component. For example, Japanese Laid-Open Patent Publication (kokai) No. 2016-82261 discloses a digital camera in which a first circuit board on which an image pickup device as a heat generating component is mounted is provided with a second path for dissipating heat to a metal housing separately from a first path for connecting to a second circuit board on which the heat generating component is mounted. In this digital camera, the heat generated in the image pickup device flows to the metal housing through the second path, thereby suppressing the temperature rise of the image pickup device while suppressing the heat transfer to the second circuit board on which the heat generating component is mounted.

However, in the technique described in Japanese Laid-Open Patent Publication (kokai) No. 2016-82261, since the second path unnecessary for controlling the image pickup device is provided on the first circuit board in order to control the flow of heat, there is a problem that downsizing of the image pickup device is hindered.

SUMMARY OF THE INVENTION

An object of the present invention is to provide an electronic device capable of suppressing a temperature rise of a heat generating component and reducing the size of the heat generating component.

Accordingly, the present invention provides an electronic device comprising a first substrate on which a first electronic component that generates heat during operation and a first connector are mounted, a second substrate on which a second electronic component that generates heat during operation and a second connector are mounted, and a cable having one end connected to the first connector and the other end connected to the second connector, wherein the second substrate has a hole defining the second substrate into a first region and a second region, and the cable is inserted through the hole, and on the second substrate, the second connector is mounted in the first region, and the second electronic component is mounted in the second region.

The present invention provides an electronic device capable of suppressing a temperature rise of a heat generating component and reducing the size of the heat generating component.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1A:
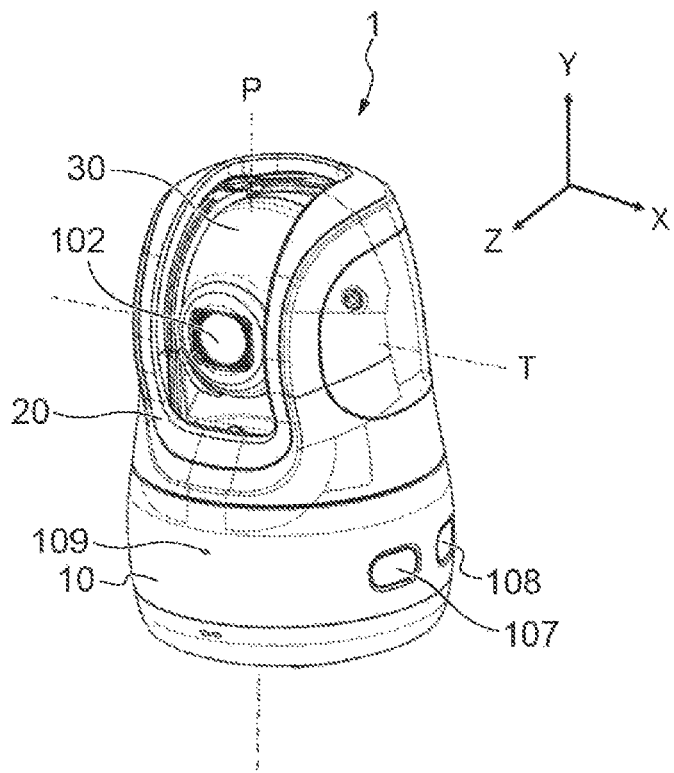
FIGS. 1A and 1B are external perspective views of an image pickup apparatus according to an embodiment of the present invention.
Figure 1B:
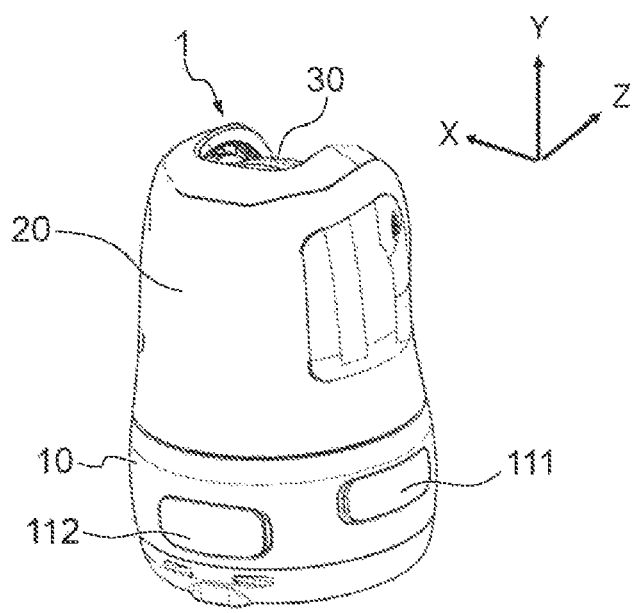
Figure 2:
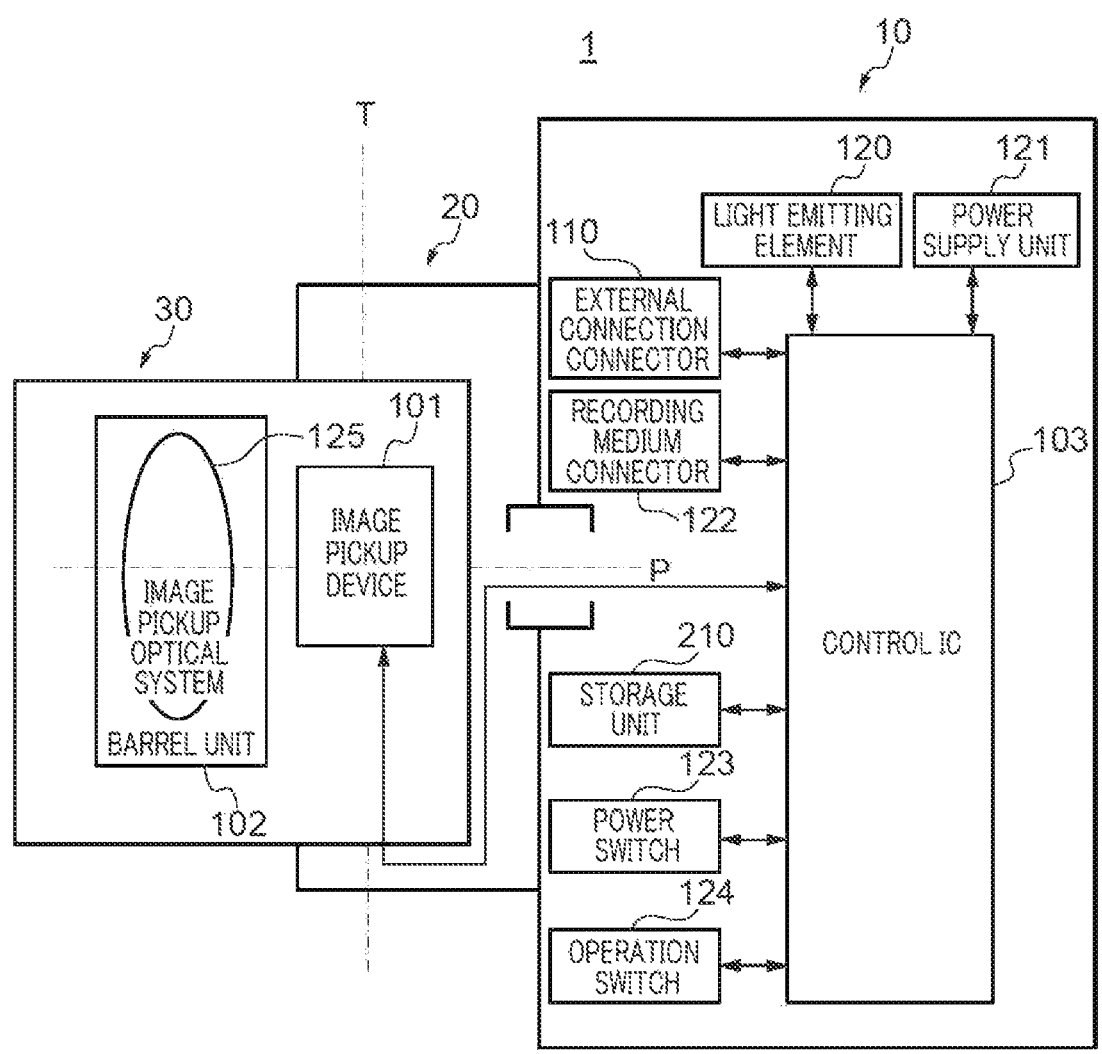
FIG. 2 is a block diagram showing a schematic configuration of the image pickup apparatus of FIG. 1.

FIG. 1A is an external perspective view showing an image pickup apparatus 1 according to an embodiment of the present invention as viewed obliquely from the front, and FIG. 1B is an external perspective view showing the image pickup apparatus 1 as viewed obliquely from the rear. FIG. 2 is a block diagram showing a schematic configuration of the image pickup apparatus 1.

For convenience of description, a three-dimensional orthogonal coordinate system shown in FIGS. 1A and 1B is set. It is defined that an X direction is a horizontal direction of the image pickup apparatus 1, a Y direction is a vertical direction of the image pickup apparatus 1, and a Z direction is a front-rear direction of the image pickup apparatus 1. In addition, the upward direction is defined as a +Y direction, the forward direction is defined as a +Z direction, and the right direction when viewed from the +Z direction is defined as a +X direction.

The image pickup apparatus 1 includes a fixing portion 10, a first movable portion 20, and a second movable portion 30. The first movable portion 20 is attached to the fixing portion 10 rotatably about a pan rotation axis P (indicated by a chain line in FIG. 1A) parallel to the Y axis. The second movable portion 30 is held by the first movable portion 20 rotatably about a tilt rotation axis T (indicated by a chain line in FIG. 1A) orthogonal to the Y axis. In this way, the image pickup apparatus 1 is configured such that the second movable portion 30 can rotate with the degree of freedom of the pan rotation axis P and the tilt rotation axis T with respect to the fixing portion 10.

The second movable portion 30 includes an image pickup device 101 and a barrel unit 102, and the barrel unit 102 includes an image pickup optical system 125. The image pickup device 101 is a CCD image sensor, a CMOS image sensor, or the like that photoelectrically converts an optical image to generate an image signal. The image pickup optical system 125 is formed by various lenses that form a subject image on the image pickup device 101, diaphragms, and the like, and the barrel unit 102 holds various components constituting the image pickup optical system 125. The optical axis direction of the image pickup optical system 125, that is, the image pickup direction, can be changed by the rotation of first movable portion 20 around the pan rotation axis P and the rotation of the second movable portion 30 around the tilt axis T.

As shown in FIGS. 1A and 1B, the fixing portion 10 is provided with a power button 107, an operation button 108, a display window 109, an external connection connector lid 111, and a recording medium connector lid 112. Furthermore, as shown in FIG. 2, the fixing portion 10 includes a control IC 103, an external connection connector 110, a light emitting element 120, a power supply unit 121, a recording medium connector 122, a storage unit 210, a power switch 123, and an operation switch 124.

The control IC 103 controls an overall operation of the image pickup apparatus 1 including a function of processing an image signal generated by the image pickup device 101 to generate image data. The image signal generated by the image pickup device 101 is transmitted to a main substrate 104 (see FIGS. 3A and 3B) through a cable 106 (see FIGS. 3A and 3B). Various electronic components and electric components, including the control IC 103, are mounted on the main substrate 104. The image data generated by the control IC 103 is stored in the storage unit 210. The storage unit 210 is, for example, a semiconductor storage device capable of storing and erasing, such as an EEPROM, but is not limited thereto.

The power supply unit 121 supplies necessary power to the control IC 103, the image pickup device 101, and the like. When the push-button switch-type power button 107 provided on the right side surface of the fixing portion 10 is pressed, the operation (pressing) is detected by the power switch 123 built in the fixing portion 10. The control IC 103 switches between a power-off state and a power-on state of the image pickup apparatus 1 according to a detection result of the power switch 123. When the push-button switch-type operation button 108 provided on the right side surface of the fixing portion 10 is pressed in a case where the image pickup apparatus 1 is in the power-on state, the operation (pressing) is detected by the operation switch 124 built in the fixing portion 10. The control IC 103 switches the operation state of the image pickup apparatus 1 according to a detection result of the operation switch 124.

The display window 109 is a transparent or translucent member and is provided on the front surface of the fixing portion 10. The light emitting element 120 is, for example, an LED or the like, and is disposed at a position facing the display window 109 inside the image pickup apparatus 1. A user can visually recognize a light emission state of the light emitting element 120 from the outside of the image pickup apparatus 1 through the display window 109. For example, the control IC 103 causes the light emitting element 120 to emit light during moving image recording by the image pickup apparatus 1. As a result, the user can recognize that the image pickup apparatus 1 is performing the moving image recording operation, by confirming the light emission of the light emitting element 120 through the display window 109. It should be noted that in the present embodiment, the display window 109 is disposed on the front surface of the fixing portion 10 in consideration of the visibility from the user, but the display window 109 may be provided at another position in consideration of the installation place and the use mode of the image pickup apparatus 1.

The external connection connector lid 111 is provided on the left side surface of the fixing portion 10, and is configured to be movable between a position where the external connection connector 110 is covered when not in use and a position where the external connection connector 110 is exposed to an external appearance when in use. The recording medium connector lid 112 is provided on the back surface side of the fixing portion 10, and is configured to be movable between a position where the recording medium connector 122 is covered when not in use and a position where the recording medium connector 122 is exposed to the external appearance when in use.

Figure 3A:
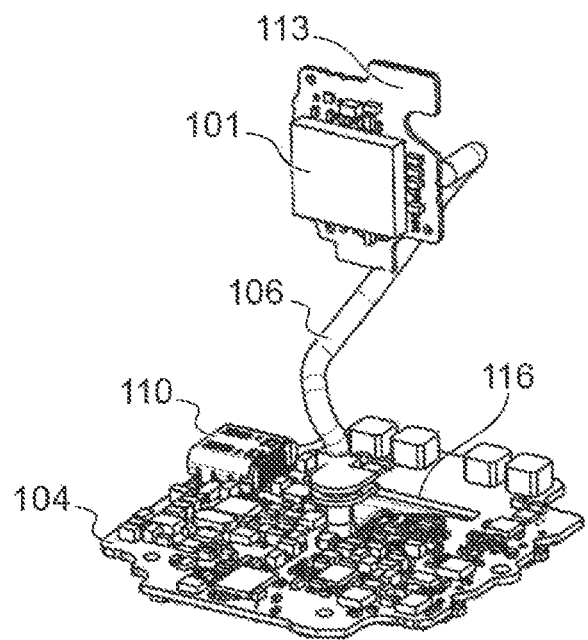
FIGS. 3A and 3B are perspective views of main members built in the image pickup apparatus of FIG. 1.
Figure 3B:
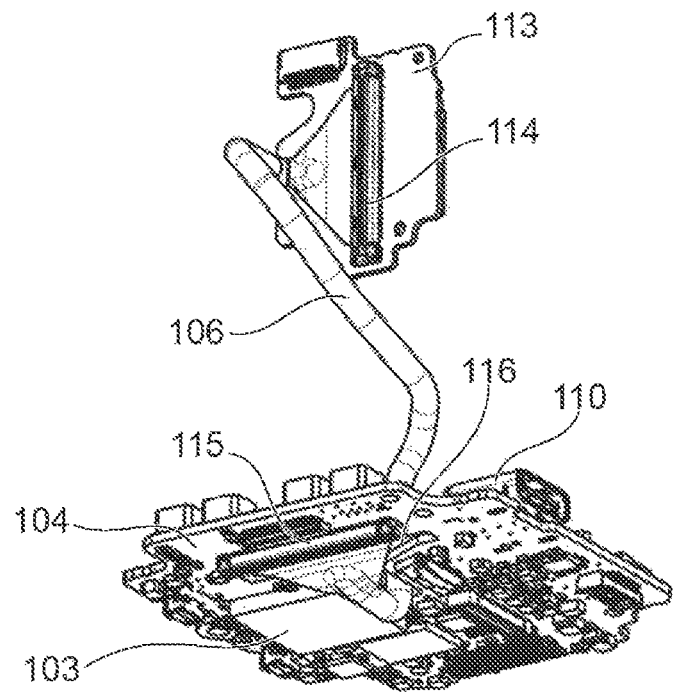

FIG. 3A is a perspective view of main members built in the image pickup apparatus 1, and FIG. 3B is a perspective view of the main members built in the image pickup apparatus 1 as viewed from a direction different from that of FIG. 3A. The image pickup device 101 is mounted on one surface of an image pickup device substrate 113. A first connector 114 is mounted on a surface of the image pickup device substrate 113 opposite to a surface on which the image pickup device 101 is mounted. The image pickup device substrate 113 is fixed to a chassis (frame) (not shown) constituting the second movable portion 30. Therefore, the image pickup device substrate 113 moves integrally with the second movable portion 30 with respect to the fixing portion 10.

An external connection connector 110 and a second connector 115 are further mounted on the main substrate 104 on which the control IC 103 is mounted. As shown in FIG. 3B, the second connector 115 and the control IC 103 are mounted on the same surface of the main substrate 104 and opposite to a surface facing the image pickup device substrate 113. On the other hand, the external connection connector 110 is mounted on the surface of the main substrate 104 opposite to the surface on which the control IC 103 is mounted. The main substrate 104 is fixed to a chassis (frame) (not shown) constituting the fixing portion 10.

One end of the cable 106 for transmitting an image signal generated by the image pickup device 101 to the main substrate 104 is connected to the first connector 114 mounted on the image pickup device substrate 113. The other end of the cable 106 is connected to the second connector 115 mounted on the main substrate 104. A main substrate hole 116 is provided on the main substrate 104 so as to pass through the main substrate 104 in a thickness direction, and the cable 106 is disposed so as to be inserted into the main substrate hole 116. Since the cable 106 has flexibility, even if the second movable portion 30 moves with respect to the fixing portion 10 and the relative positional relationship between the image pickup device substrate 113 and the main substrate 104 changes, the electrical connection between the image pickup device substrate 113 and the main substrate 104 via the cable 106 is maintained.

Figure 4:
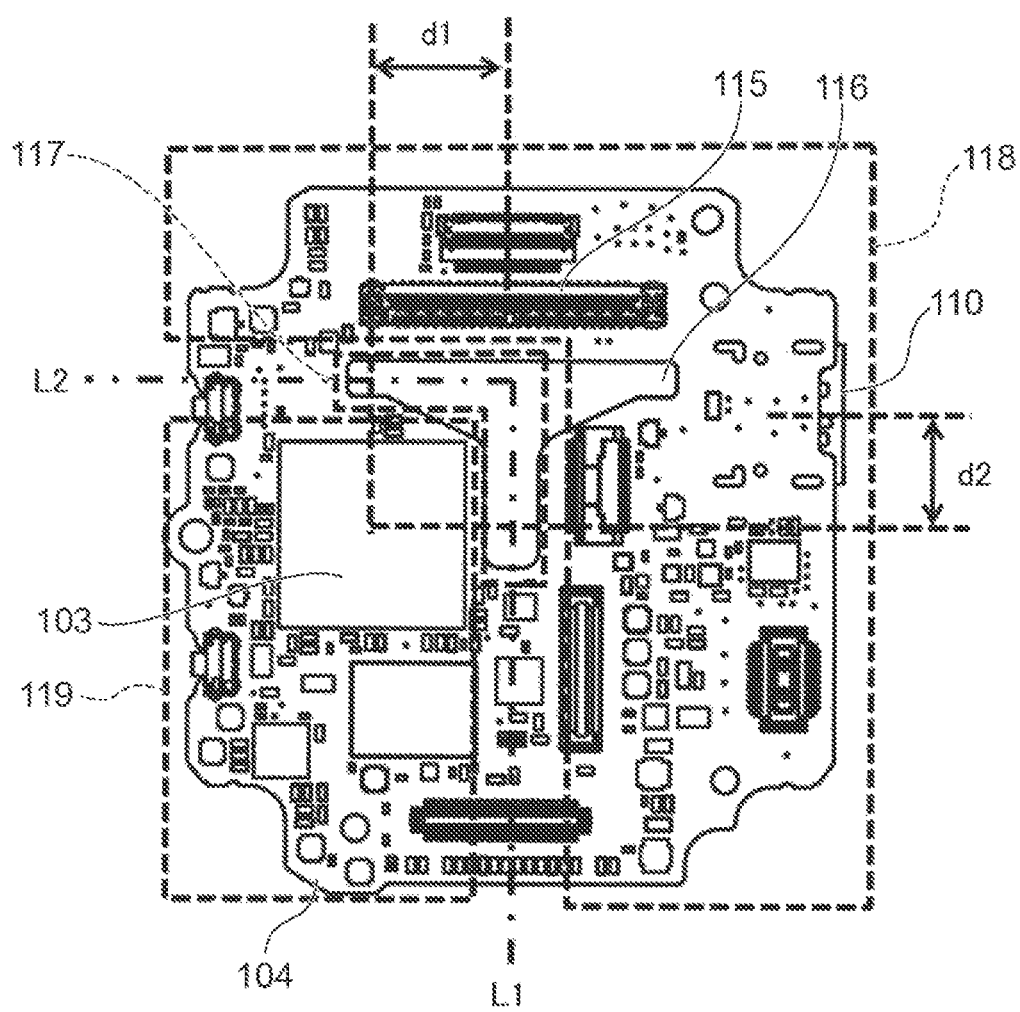
FIG. 4 is a plan view of a main substrate built in the image pickup apparatus of FIG. 1.

Next, control of a flow of heat generated inside the image pickup apparatus 1 will be described. FIG. 4 is a plan view of the main substrate 104 and shows a surface on which the control IC 103 is mounted.

When the temperature of the image pickup device 101 rises too much, noise included in the image signal increases (the S/N ratio decreases) and thus, the image pickup device 101 is one of electronic components whose temperature rise should be suppressed as much as possible. In addition, the control IC 103 is an electronic component that not only processes the image signal generated by the image pickup device 101 but also manages various controls of the image pickup apparatus 1, and generates the largest amount of heat among the electronic components mounted on the main substrate 104. Then, since the processing capability of the control IC 103 decreases when the temperature of the control IC 103 rises too much, the control IC 103 is one of electronic components whose temperature rise should be suppressed as much as possible.

In the image pickup apparatus 1, heat flowing to the second connector 115 in the heat generated by the control IC 103 flows from the second connector 115, via the cable 106 and the first connector 114, to the image pickup device substrate 113. Therefore, when the heat generated from the control IC 103 flows too much to the second connector 115, there is a possibility that the temperature rise of the image pickup device 101 mounted on the image pickup device substrate 113 is accelerated. In addition, since the external connection connector 110 mounted on the main substrate 104 is a component that may be directly touched by the user, the user may feel uncomfortable when the temperature rises too much. For these reasons, it is necessary to reduce the amount of heat, which was generated by the control IC 103 having a large amount of heat generation and flows to the second connector 115 and the external connection connector 110, as much as possible. In the present embodiment, the main substrate 104 is configured as follows to thereby solve this problem.

That is, the main substrate hole 116 has a substantially T-shape having a portion (hereinafter referred to as an "L-shaped portion 117") formed in a substantially L-shape as indicated by a broken line in FIG. 4. In addition, the control IC 103 has a substantially rectangular shape when viewed from the thickness direction of the main substrate 104. The two linear holes (I-shaped holes) constituting the L-shaped portion 117 respectively face two sides of the control IC 103 substantially orthogonal to (continuous with) each other.

Here, a line (hereinafter referred to as "region-defining line L1, L2") is defined by extending the center line of each of the two linear holes constituting the L-shaped portion 117 to the side opposite to an intersection of the two linear holes. In other words, the region-defining lines L1 and L2 are straight lines extending from the intersection of the two linear holes toward the respective end points and are indicated by chain lines in FIG. 4. The main substrate 104 is defined into a first region 118 and a second region 119 by the region-defining lines L1 and L2.

In the main substrate 104, the control IC 103, which is a main heat source, is mounted in the second region 119, and the second connector 115 and the external connection connector 110, of which the temperature rises are required to be suppressed, are disposed in the first region 118. The two linear holes constituting the L-shaped portion 117 are opposed respectively to the two continuous sides (two orthogonal sides) of the control IC 103. Therefore, the flow of heat from the second region 119 where the control IC 103 is mounted to the first region 118 where the second connector 115 and the external connection connector 110 are mounted is reduced by the two linear holes of the L-shaped portion 117. In this way, it is possible to suppress the temperature rise of the second connector 115 and the external connection connector 110.

The second connector 115 is mounted on the main substrate 104 such that its longitudinal direction is parallel to the region-defining line L2. Further, at this time, the second connector 115 is mounted on the main substrate 104 such that the center of the second connector 115 is shifted from the center of the control IC 103 toward the region-defining line L1 (toward the right side in FIG. 4) by a predetermined distance d1 in a length direction of the region-defining line L2 (the left-right direction in FIG. 4). In other words, the center of the second connector 115 is shifted from the center of the control IC 103 by the distance d1 in a length direction of the linear hole interposed between the second connector 115 and the control IC 103 and toward the intersection side of the two linear holes. In this way, by mounting the second connector 115 on the main substrate 104 so that the second connector 115 is not opposed to the control IC 103 without interposing the L-shaped portion 117 of the main substrate hole 116, heat transfer from the control IC 103 to the second connector 115 can be more effectively suppressed.

Furthermore, in the image pickup apparatus 1, the cable 106 can be inserted into the main substrate hole 116 provided in the main substrate 104 and be routed to the surface of the main substrate 104 opposite to the surface facing the image pickup device substrate 113. Therefore, the second connector 115 is mounted on the surface of the main substrate 104 opposite to the surface facing the image pickup device substrate 113. As a result, by designing the connection length of the cable 106 from the second connector 115 to the image pickup device substrate 113 to be long to increase the amount of heat dissipated from the cable 106, heat transfer from the second connector 115 to the image pickup device substrate 113 can be suppressed.

The external connection connector 110 is mounted on the main substrate 104 such that the longitudinal direction thereof is parallel to the region-defining line L1. In addition, the external connection connector 110 is mounted on the main substrate 104 such that the center of the external connection connector 110 is shifted from the center of the control IC 103 toward the region-defining line L2 (toward the upper side in FIG. 4) by a predetermined distance d2 in a length direction of the region-defining line L1 (in the vertical direction in FIG. 4). In this way, by mounting the external connection connector 110 on the main substrate 104 so that the external connection connector 110 is not opposed to the control IC 103 without interposing the L-shaped portion 117 of the main substrate hole 116, heat transfer from the control IC 103 to the external connection connector 110 can be more effectively suppressed. In addition, the external connection connector 110 and the control IC 103 are mounted on different surfaces of the main substrate 104. Therefore, heat transfer from the control IC 103 to the external connection connector 110 can be more effectively suppressed.

Although the image pickup apparatus has been described above as an embodiment of the electronic device according to the present invention, the present invention is not limited to the image pickup apparatus and can be applied to various electronic devices comprising a substrate on which an electronic component (heat generating component) that generates heat during operation is mounted. In particular, the present invention is suitable for an electronic device in which a plurality of substrates on which a heat-generating component is mounted needs to be connected by a cable, and an electronic device which incorporates a substrate on which a heat-generating component and a connector or the like which is touchable from the outside by a user are mounted.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-119293, filed Jul. 10, 2020, which is hereby incorporated by reference wherein in its entirety.

What is claimed is:

1. An electronic device comprising:
a first substrate on which a first electronic component that generates heat during operation and a first connector are mounted;
a second substrate on which a second electronic component that generates heat during operation and a second connector are mounted; and
a cable having one end connected to the first connector and the other end connected to the second connector,
wherein the second substrate has a hole defining the second substrate into a first region and a second region, and the cable is inserted through the hole, and
on the second substrate, the second connector is mounted in the first region; and the second electronic component is mounted in the second region.

2. The electronic device according to claim 1, wherein a plurality of electronic components is mounted on the second substrate, and the second electronic component generates a largest amount of heat among the plurality of electronic components.

3. The electronic device according to claim 1, wherein the second connector is mounted on a surface of the second substrate opposite to a surface facing the first substrate.

4. The electronic device according to claim 1, wherein the hole has a first linear hole and a second linear hole at least a part of which is formed in a substantially L shape, and the first region and the second region in the second substrate are defined by straight lines extending from an intersection of the first linear hole and the second linear hole toward respective end points.

5. The electronic device according to claim 4, wherein the second electronic component has a substantially rectangular shape when viewed from a thickness direction of the second substrate, and the first linear hole and the second linear hole face two sides of the second electronic component substantially orthogonal to each other.

6. The electronic device according to claim 5, wherein
the second electronic component and the second connector are mounted on a same surface of the second substrate with the first linear hole interposed therebetween, and
a center of the second connector is shifted from a center of the second electronic component by a predetermined distance in a length direction of the first linear hole and toward an intersection side of the first linear hole and the second linear hole.

7. The electronic device according to claim 5, further comprising a third connect, mounted on the second substrate,
wherein the third connector is mounted in the first region.

8. The electronic device according to claim 7, wherein
the second linear hole is interposed between the second electronic component and the third connector, and
a center of the third connector is shifted from a center of the second electronic component by a predetermined distance in a length direction of the second linear hole and toward the intersection side of the first linear hole and the second linear hole.

9. The electronic device according to claim 7, wherein the third connector is mounted on a surface of the second substrate opposite to a surface on which the second electronic component is mounted.

10. The electronic device according to claim 1, wherein
the electronic device is an image pickup apparatus,
the first electronic component is an image pickup device, and
the second electronic component is a control IC that controls an operation of the image pickup apparatus.

11. An electronic device comprising:
a substrate having a hole at least a part of which is formed in a substantially L shape;
an electronic component that generates heat during operation; and
a connector,
wherein the substrate is defined into a first region and a second region by two linear holes forming the hole, and
the connector is mounted in the first region, and the electronic component is mounted in the second region.

* * * * *